United States Patent [19]

Watanabe

[11] Patent Number: 5,418,745

[45] Date of Patent: May 23, 1995

[54] SEMICONDUCTOR MEMORY DEVICE FOR CONTINUOUSLY ACCESSING A MEMORY CELL ARRAY DIVIDED ACCORDING TO A COLUMN ADDRESS

[75] Inventor: Nobuo Watanabe, Yokohama, Japan

[73] Assignee: Kabushiki Kaisha Toshiba, Kawasaki, Japan

[21] Appl. No.: 199,974

[22] Filed: Feb. 22, 1994

Related U.S. Application Data

[63] Continuation of Ser. No. 769,784, Oct. 2, 1991, abandoned.

[30] Foreign Application Priority Data

Oct. 2, 1990 [JP] Japan .................................. 2-264875

[51] Int. Cl.$^6$ ............................................. G11C 13/00
[52] U.S. Cl. ........................... 365/189.05; 365/230.05; 365/189.12; 365/230.09
[58] Field of Search ...................... 365/230.05, 230.09, 365/230.06, 189.08, 189.12, 230.04, 189.05, 240

[56] References Cited

U.S. PATENT DOCUMENTS

| | | | |
|---|---|---|---|
| 4,757,477 | 6/1988 | Nagayama et al. | 365/230.05 |
| 4,947,373 | 8/1990 | Yamaguchi et al. | 365/189.04 |
| 5,029,134 | 7/1991 | Watanabe | 365/189.12 |

FOREIGN PATENT DOCUMENTS

| | | |
|---|---|---|
| 0178922 | 4/1986 | European Pat. Off. . |
| 0326172 | 8/1989 | European Pat. Off. . |
| 0479163 | 4/1992 | European Pat. Off. . |
| WO91/17544 | 11/1991 | WIPO . |

Primary Examiner—Joseph A. Popek
Assistant Examiner—Vu Le
Attorney, Agent, or Firm—Foley & Lardner

[57] ABSTRACT

A semiconductor memory device having: a memory cell array with random accessible memory cells disposed in a matrix form, the memory cell array including first memory cell arrays and second memory cell arrays alternately disposed in a column direction, and the first and second memory cell arrays being divided in accordance with a column address; a data register unit for storing one row data of the memory cell array, the data register unit being serially accessed by an external circuit, the data register unit having first data registers and second data registers alternately disposed in the column direction; and a data transfer gate unit including a plurality of data transfer gates for controlling data transfer between the memory cell array and the data register unit, each of the plurality of data transfer gates including a gate for connecting each of the first memory cell array to each of the first data registers, and a gate for connecting each of the second memory array to each of the second data registers, and further including a gate for connecting each of the first memory cell array to each of the second data registers, and a gate for connecting each of the second memory cell arrays to each of the first data registers.

4 Claims, 3 Drawing Sheets

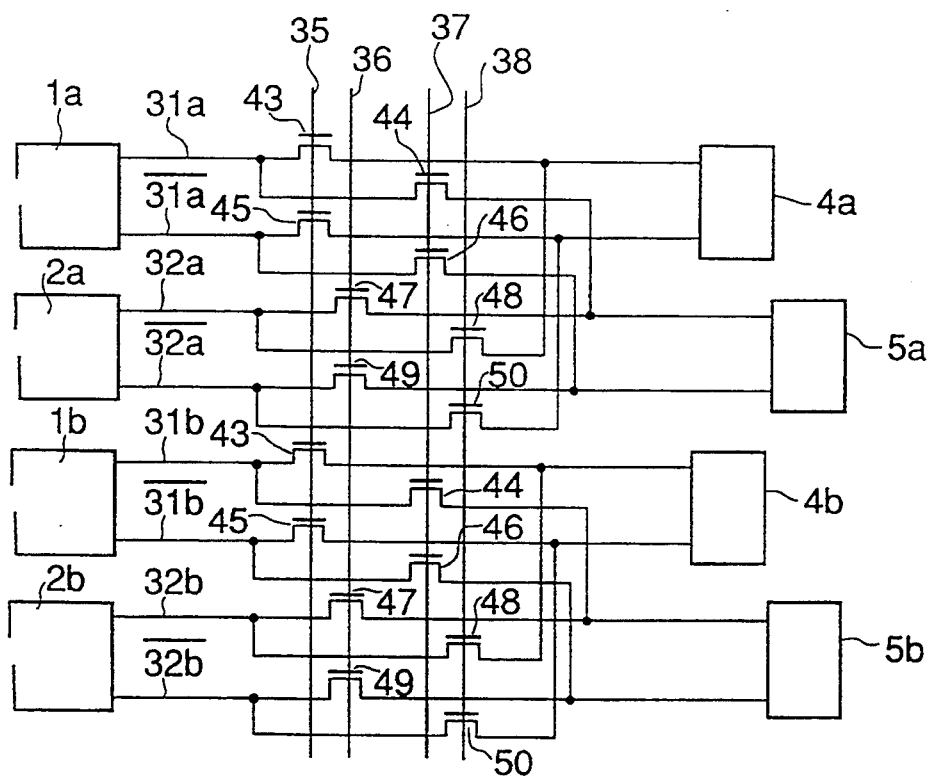
F I G . 3
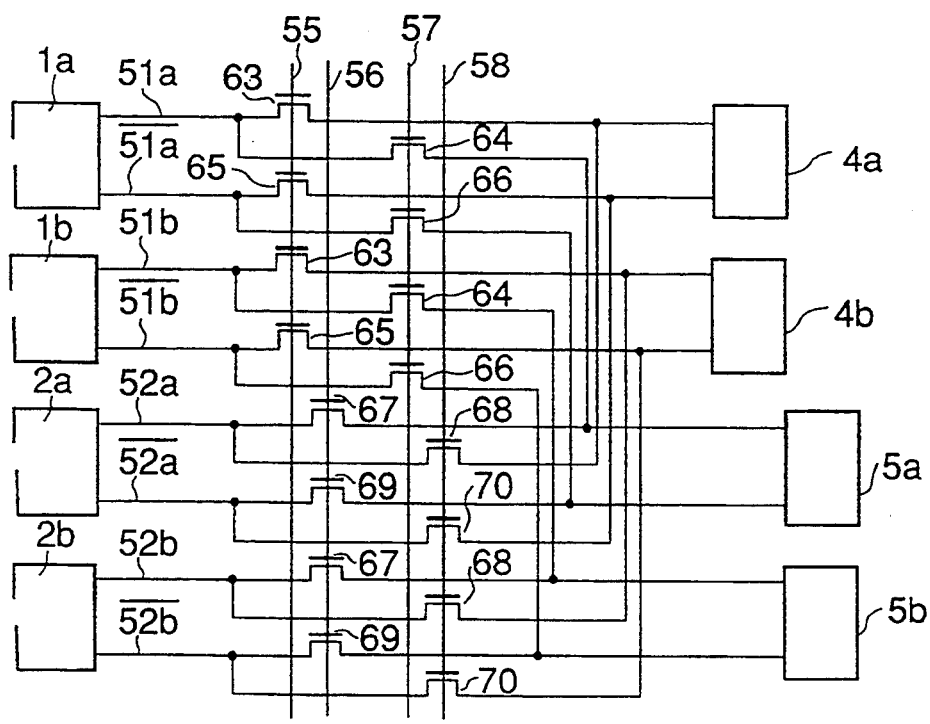
F I G . 4

SEMICONDUCTOR MEMORY DEVICE FOR CONTINUOUSLY ACCESSING A MEMORY CELL ARRAY DIVIDED ACCORDING TO A COLUMN ADDRESS

This application is a continuation of application Ser. No. 07/769,784, filed Oct. 2, 1991, now abandoned.

BACKGROUND OF THE INVENTION

The present invention relates to a semiconductor memory device, and more particularly to a semiconductor memory device of a multi-port structure having a RAM port for random access of memory cells and a SAM port for serial access.

A conventional semiconductor memory device of a multi-port structure is shown in FIG. 5. A memory cell array 61 is provided as a RAM port, which array has memory cells disposed in a matrix shape and is randomly accessible. A data register 63 is also provided as a SAM port, which register stores one row of data and is serially accessible.

The memory cell array 61 is divided into a lower level memory cell array 61a to be accessed by the most significant bit (MSB) "0" of a column address, and an upper level memory cell array 61b to be accessed by MSB "1" of a column address. The data register 63 is also divided into a lower level data register 63a and an upper level data register 63b. A data transfer gate 62a is provided for data transfer between the data register 63a and memory cell array 61a, and a data transfer gate 62b is provided for data transfer between the data register 63b and memory cell array 61b.

The connection between the data transfer gate 62a and data register 63a within a circuit portion A enclosed by a broken line is as shown in FIG. 6. A pair of bit lines 71a and $\overline{71a}$ are connected to transistors 76 serving as the data transfer gate 62a. Each of the transistors 76 becomes conductive when a drive signal is applied to its gate via a signal line 75 connected thereto.

In a conventional device, a pair of bit lines 71a and $\overline{71a}$ on the RAM port side is made in one-to-one correspondence with each data register 77 on the SAM port side. In the split transfer between the memory cell array 61 and data register 63 at upper and lower levels, data is transferred via the data transfer gate 62a between the memory cell array 61a and data register 63a, and via the data transfer gate 62b between the memory cell array 61b and data register 63b.

An active one of the data registers 63a and 63b which are alternately made active is used for the data transfer of the SAM port to an external circuit. Used in the data transfer between the SAM port and RAM port, therefore, is one of the data registers alternately placed in a standby state which is not now transferring data to an external circuit.

For this reason, if continuous data read/write is to be executed by using the data register 63 in the split transfer manner, it has been necessary to alternately access the lower and upper memory cell arrays 61a and 61b, and it has not been possible to continuously access only one of the memory cell arrays, i.e., to continuously access only one of the memory cell arrays 61a and 61b from the SAM port. If a frame buffer were to be constructed using such a RAM and SAM port, there arises a problem of some restriction in mapping between a display screen and the memory.

SUMMARY OF THE INVENTION

It is therefore an object of the present invention to provide a semiconductor memory device capable of continuously accessing the same memory cell array among memory cell arrays divided according to a column address, in the split transfer to data registers.

In order to achieve the above object of the present invention, there is provided a semiconductor memory device of a multi-port structure constructed of a memory cell array having random accessible memory cells disposed in a matrix form, a data register unit for storing one row data of the memory cell array, and a data transfer gate unit for controlling data transfer between the memory cell array and the data register unit. The memory cell array includes first memory cell arrays and second memory cell arrays alternately disposed in a column direction, the first and second memory cell arrays being divided in accordance with an MSB of a column address. The data register unit has first data registers and second data registers alternately disposed in the column direction. Each of a plurality of data transfer gates of the data transfer gate unit has a gate for connecting each of the first memory cell array to each of the first data registers, and a gate for connecting each of the second memory arrays to each of the second data registers, and further has a gate for connecting cell of the first memory cell array to each of the second data registers, and a gate for connecting each of the second memory cell arrays to each of the first data registers, so as to allow continuous data transfer relative to the first or second memory cell array.

The data transfer gate unit connects each of the first memory cell arrays to a corresponding one of the first data registers, and each of the second memory cell arrays to a corresponding one of the second data registers. Therefore, data transfer is allowed between each of the first memory cell arrays and the corresponding one of the first data registers, and between each of the second memory cell arrays and the corresponding one of the second data registers.

The data transfer gate unit connects each of the first memory cell arrays to a corresponding one of the first data registers, and then connects the first memory cell array to a not-corresponding one of the second data registers. Therefore, data transfer is allowed between the first memory cell array and the first or second data register. Similarly, the data transfer gate unit connects each of the second memory cell arrays to a not-corresponding one of the first data registers, and then connects the second memory cell array to a corresponding one of said second data registers. Therefore, data transfer is allowed between the second memory cell array and the first or second data register. In this manner, it is possible to continuously transfer data relative to one of the first and second memory cell arrays.

BRIEF DESCRIPTION OF THE DRAWINGS

In the accompanying drawings:

FIG. 3 is a block diagram showing the structure of a data transfer gate of a semiconductor memory device according to another embodiment of the present invention;

FIG. 4 is a block diagram showing the structure of a data transfer gate of a semiconductor memory device according to a further embodiment of the present invention;

DESCRIPTION OF THE PREFERRED EMBODIMENTS

Figure 1:
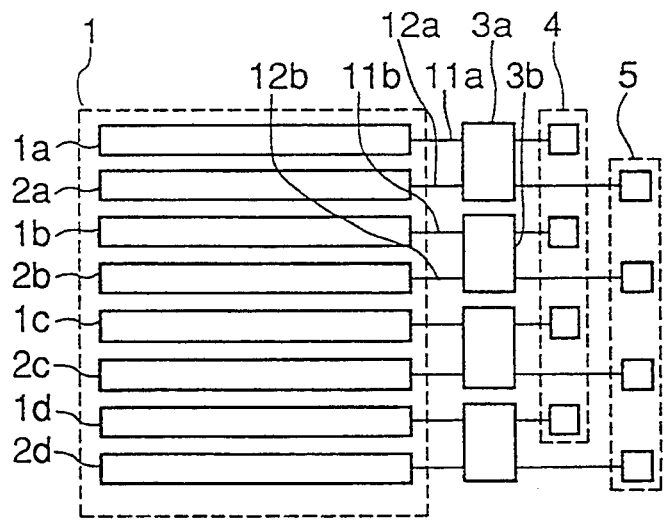
FIG. 1 is a block diagram showing the structure of a semiconductor memory device according to an embodiment of the present invention.

Preferred embodiments of the present invention will be described with reference to the accompanying drawings. FIG. 1 shows the structure of a semiconductor memory device according to one embodiment. As described above, in a conventional semiconductor memory device, two memory cell arrays divided by MSB of a column address are each collectively disposed into two independent groups. In contrast with this, in a memory cell array 1 of this embodiment, finely divided memory cell arrays 1a, 1b, 1c, ... having MSB "0" of a column address and memory cell arrays 2a, 2b, 2c, ... having MSB "1" are alternately disposed in the column direction.

Similarly, finely divided lower level data registers 4 and upper level data registers 5 are alternately disposed. A data transfer gate 3a is provided between the memory cell arrays 1a, 2a and the data registers 4 and 5. Another data transfer gate 3b is provided between the memory cell arrays 1b, 2b and the data registers 4 and 5 and so on.

In this memory device, one bit data is transferred by a single bit line. Bit lines 11a, 11b, 12a, 12b, ... are connected respectively to the memory cell arrays 1a, 1b, 2a, 2b, ....

Figure 2:
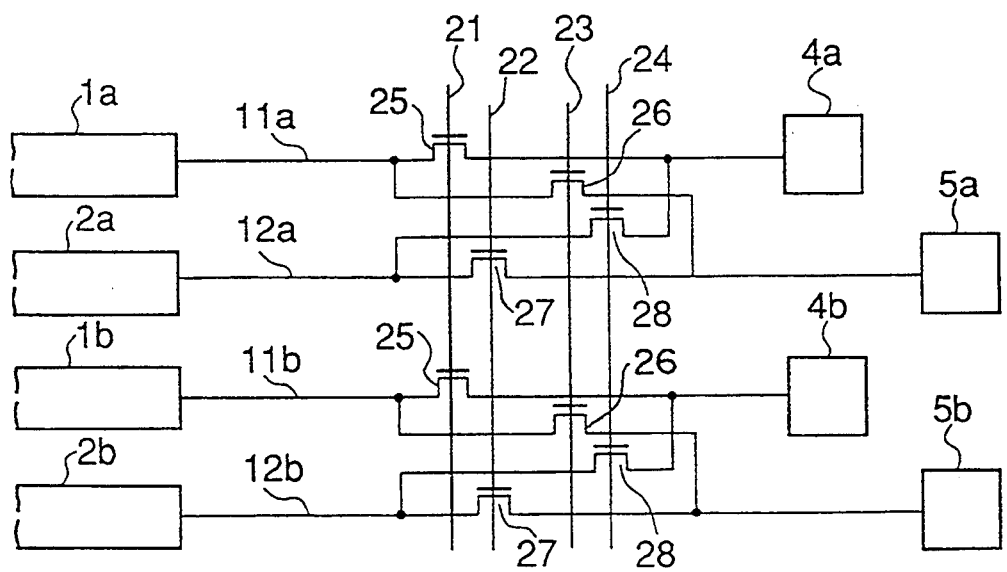
FIG. 2 is a block diagram showing the structure of the data transfer gate of the device shown in FIG. 1.
Figure 5:
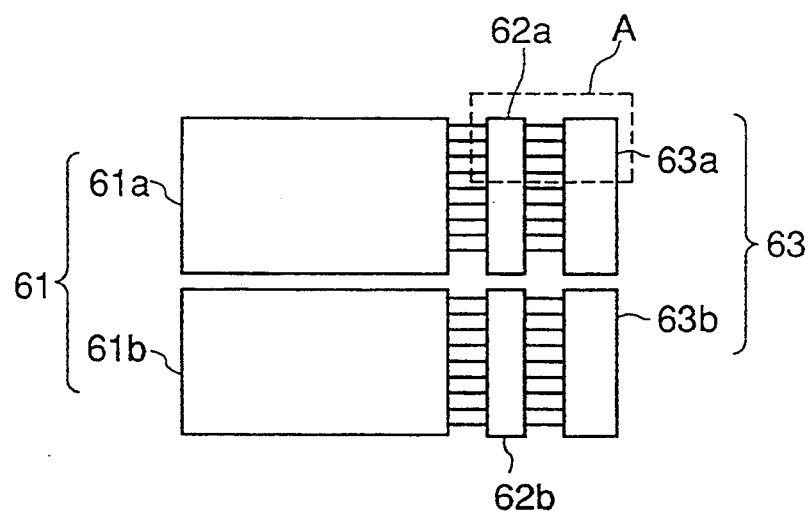
FIG. 5 is a block diagram showing the structure of a conventional semiconductor memory device.
Figure 6:
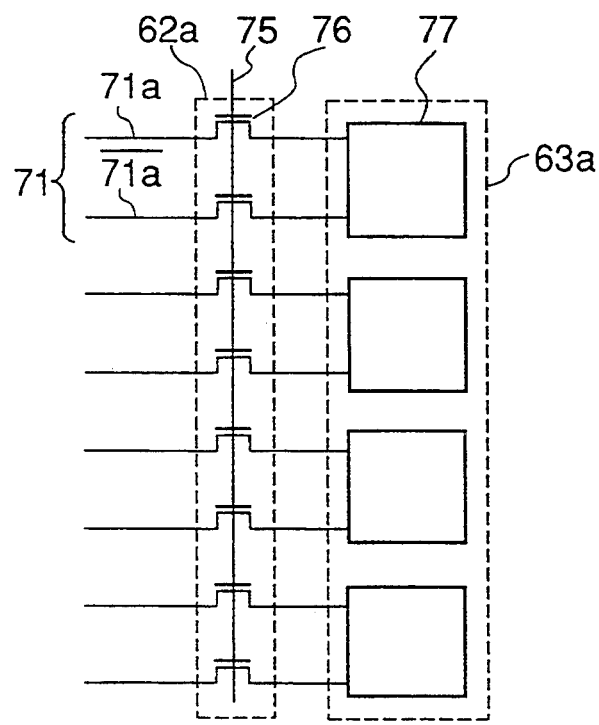
FIG. 6 is a block diagram showing the structure of the data transfer gate of the device shown in FIG. 5.

The structure of the data transfer gates 3a and 3b are shown in FIG. 2. A transistor 25 is connected between the memory cell array 1a, and data register 4a both having MSB "0" of a column address. A transistor 27 is connected between the memory cell array 2a and data register 5a, both having MSB "1". In addition, the memory cell array 1a and data register 5a, each having a different MSB, are coupled by a transistor 26, and the memory cell array 2a and data register 4a, each having a different MSB, are coupled by a transistor 28. Each gate of the transistors 25, 26, 27, and 28 is connected to a corresponding one of signal lines 21, 23, 22, and 24.

In an ordinary transfer operation, the conduction of the transistors is so controlled that the memory cell array and data register associated with the same MSB are connected. For example, upon application of control signals to the gates of the transistors 25 and 27 via the signal lines 21 and 22, the transistors 25 and 27 become conductive so that the memory cell array 1a and data register 4a, as well as the memory cell array 2a and data register 5a are electrically connected together. In this case, the transistors 26 and 28 are maintained nonconductive so that the memory cell array and data register, each having a different MSB, are electrically separated. In this manner, similar to a conventional device, data transfer is executed between the memory cell arrays 1a, 1b, ... and lower level data resisters 4a, 4b, ..., all having MSB "0", and between the memory cell arrays 2a, 2b, ... and upper level data registers 5a, 5b, ..., all having MSB "1".

Continuous access, for example, to the memory cell arrays 1a, 1b, ... having MSB "0" is carried out in the following manner. Assuming that the data registers 4a, 4b, ... are in a standby state, transistors 25 are made conductive via the signal line 21 so that data transfer is allowed between the data registers 4a, 4b, ... and memory cell arrays 1a, 1b, .... Thereafter, when the data registers 5a, 5b, ... enter the standby state, the transistors 23 are made conductive via the signal line 23, so that data transfer is allowed between the memory cell arrays 1a, 1b, ... and data registers 5a, 5b, ....

Similarly, continuous access to the memory cell arrays 2a, 2b, ... having MSB "1" is effected by alternately making conductive the transistors 27 and 28. Data transfer is then executed relative to the data registers 4a, 4b, ... or data registers 5a, 5b, ... in the standby state.

Another embodiment of the present invention will be described below. A point of this embodiment different from the above-described embodiment is that one bit data is transferred using a pair of bit lines. The structure of the data transfer gate of this embodiment device is as shown in FIG. 3. For example, a memory cell array 1a and data register 4a, both having MSB "0", are connected by a pair of bit lines 31a and $\overline{31a}$, and a memory cell array 2a and data register 5a, both having MSB "1", are connected by a pair of bit lines 32a and $\overline{32a}$.

The data transfer gate is constructed in the following manner. Transistors 43 and 45 are provided between the memory cell array 1a and data register 4a, both having MSB "0", and transistors 47 and 49 are provided between a memory cell array 2a and data register 5a, both having MSB "1". In addition, transistors 44 and 46 are connected between the memory cell array 1a and data register 5a, each having a different MSB, and transistors 48 and 50 are connected between the memory cell array 2a and data register 4a. A signal line 35 is connected to the gates of transistors 43 and 45, and a signal line 37 is connected to the gates of the transistors 44 and 46. A signal line 36 is connected to the gates of the transistors 47 and 49, and a signal line 38 is connected to the gates of the transistors 48 and 50.

In an ordinary transfer operation, the memory cell array and data register associated with the same MSB are connected. For example, upon application of control signals to the signal lines 35 and 36, the transistors 43, 45, and the transistors 47 and 49 are made conductive so that the memory cell array 1a and data register 4a, and the memory cell array 2a and data register 5a, are connected together. In this manner, data transfer is carried out between the memory cell array 1a and data register 4a, and between the memory cell array 2a and register 5a.

Continuous access, for example, to the memory cell arrays 1a, 1b, 1c, ... having MSB "0" of a column address is carried out in the following manner. Assuming that the data registers 4a, 4b, ... are in a standby state, transistors 43 and 45 are made conductive so that the memory cell array 1a and data register 4a as well as the memory cell array 1b and data register 4b are connected together to allow data transfer. Thereafter, when the data registers 5a, 5b, ... enter the standby state, the transistors 44 and 46 are made conductive via the signal line 26 so that the memory cell array 1a and data register 5a as well as the memory cell array and data register 5b are connected together to allow data transfer.

In this embodiment, each memory cell array in each column is connected to another data register, for example, in a manner that the memory cell array 1a is connected not only to the data register 4a but also to the data register 5a. In contrast with this, in an embodiment shown in FIG. 4, each memory cell array in each column is connected to another data register corresponding to every second column. For example in FIG. 4, a memory cell array 1a is connected not only via transistors 63 and 65 to a data register 4a, but also via transistors 64 and 66 to another data register 5a. Similarly, a memory cell array 1b is connected not only via transistors 63 and 65 to a data register 4b, but also via transistors 64 and 66 to another data register 5b.

Likewise, a memory array 2a is connected via transistors 67 and 69 to the data register 5a, and via transistors 68 and 70 to the data register 4a. A memory array 2b is connected via the transistors 67 and 69 to a data register 5b, and via the transistors 68 and 70 to the data resister 4b.

In an ordinary data transfer, similar to the above embodiments, for example, the memory cell array 1a and data register 4a, as well as the memory cell array 2a and data register 5a, are connected together. In continuously accessing memory cell arrays having MSB "0" of a column address, for example, the memory cell 1a is alternately connected to one of the data registers 4a and 5a in a standby state.

As described above, in any one of the above-described embodiments, it is possible to continuously access one of the upper and lower level memory cell arrays using a SAM port in a split transfer, without accessing alternately between them. Therefore, if a frame buffer is constructed using such a RAM and SAM port, there is no restriction in mapping a display screen and the memory.

The above-described embodiments of the present invention have been described only for illustrative purpose, and the present invention is not limited thereto. For example, the structure of the data transfer gate is not limited to those shown in FIGS. 2 to 4, but any other type of a data transfer gate may be used if it can properly control the connection between memory cell arrays and data registers.

What is claimed is:

1. A semiconductor memory device comprising:
   a memory cell array having random accessible memory cells disposed in a matrix form, said memory cell array including first memory cell arrays and second memory cell arrays alternately disposed in a column direction, said first and second memory cell arrays being divided in accordance with a column address;
   a data register unit for storing one row of data of said memory cell array, said data register unit being serially accessed by an external circuit, said data register unit having first data registers and second data registers alternately disposed in the column direction; and
   a data transfer gate unit including a plurality of data transfer gates for controlling data transfer between said memory cell array and said data register unit, each of said plurality of data transfer gates comprising a gate directly for connecting each of said first memory cell arrays to each of said first data registers, and a gate directly for connecting each of said second memory arrays to each of said second data registers, and further comprising a gate directly for connecting each of said first memory cell arrays to each of said second data registers, and a gate directly for connecting each of said second memory cell arrays to each of said first data registers, so as to allow continuous data transfer relative to said first or second memory cell array.

2. A semiconductor memory device according to claim 1, wherein, each of said plurality of data transfer gates comprising a pair of gates in a first bit line pair connecting each of said first memory cell arrays and each of said first data registers, a pair of gates provided in a second bit line pair connecting each of said second memory cell arrays and each of said second data registers, a pair of gates between each of said first memory cell arrays and each of said second data registers, and a pair of gates provided between each of said second memory cell arrays and each of said first data registers, so as to allow continuous data transfer relative to said first or second memory cell array.

3. A semiconductor memory device comprising:
   a memory cell array having random accessible memory cells disposed in a matrix form, said memory cell array including first memory cell arrays and second memory cell arrays alternately disposed in a column direction, said first and second memory cell arrays being divided in accordance with a column address;
   a data register unit for storing one row of data of said memory cell array, said data register unit being serially accessed by an external circuit, said data register unit having first data registers and second data registers alternately disposed in the column direction;
   a data transfer gate unit including a plurality of data transfer gates for controlling data transfer between said memory cell array and said data register unit, each of said plurality of data transfer gates comprising a first gate for connecting each of said first memory cell arrays to each of said first data registers, and a second gate for connecting each of said second memory arrays to each of said second data registers, and further comprising a third gate for connecting each of said first memory cell arrays to each of said second data registers, and a fourth gate for connecting each of said second memory cell arrays to each of said first data registers, so as to allow continuous data transfer relative to said first or second memory cell array;
   wherein, when said first and second gates are open at the same time data are transferred between said first memory cell arrays and said first data registers and data are transferred between said second memory cell arrays and said second data registers, and when said third and fourth gates are open at the same time data are transferred between said first memory cell arrays and said second data registers and data are transferred between said second memory cell arrays and said first registers.

4. The semiconductor memory device according to claim 3, wherein said first gate has a pair of gates provided between a first bit line pair connecting each of said first memory cell arrays and each of said first data registers, said second gate having a pair of gates provided between a second bit line pair connecting each of said second memory cell arrays and each of said second data registers, said third gate having a pair of gates provided between a third bit line pair connecting each of said first memory cell arrays and each of said second data registers, and said fourth gate having a pair of gates provided between a fourth bit line pair connecting each of said second memory cell arrays and each of said first data registers.

* * * * *